United States Patent
Babu et al.

(10) Patent No.: US 12,233,602 B2
(45) Date of Patent: Feb. 25, 2025

(54) TOOL PATH DATA GENERATION IN ADDITIVE MANUFACTURING

(71) Applicant: Alloyed Limited, Yarnton (GB)

(72) Inventors: Sarat Babu, London (GB); Jovan Djordje Stojsavljevic, East Sussex (GB)

(73) Assignee: Alloyed Limited, Yarnton (GB)

( * ) Notice: Subject to any disclaimer, the term of this patent is extended or adjusted under 35 U.S.C. 154(b) by 137 days.

(21) Appl. No.: 17/257,427

(22) PCT Filed: Jun. 20, 2019

(86) PCT No.: PCT/GB2019/051730
§ 371 (c)(1),
(2) Date: Dec. 31, 2020

(87) PCT Pub. No.: WO2020/008165
PCT Pub. Date: Jan. 9, 2020

(65) Prior Publication Data
US 2021/0146623 A1  May 20, 2021

(30) Foreign Application Priority Data
Jul. 2, 2018  (GB) .................................. 1810848

(51) Int. Cl.
*B29C 64/386* (2017.01)
*B22F 10/10* (2021.01)
(Continued)

(52) U.S. Cl.
CPC ............ *B29C 64/386* (2017.08); *B22F 10/10* (2021.01); *B22F 10/80* (2021.01); *B33Y 50/00* (2014.12);
(Continued)

(58) Field of Classification Search
CPC ....... B29C 64/386; B33Y 50/00; B22F 10/80; G05B 19/4099; G05B 2219/49013; G05B 2219/49019
See application file for complete search history.

(56) References Cited

U.S. PATENT DOCUMENTS

| | | |
|---|---|---|
| 5,184,307 A | 2/1993 | Hull et al. |
| 5,209,878 A | 5/1993 | Smalley et al. |
| (Continued) | | |

FOREIGN PATENT DOCUMENTS

| | | |
|---|---|---|
| EP | 1170115 | 1/2002 |
| JP | H05278123 | 10/1993 |
| (Continued) | | |

*Primary Examiner* — Robert E Fennema
*Assistant Examiner* — Yvonne Trang Follansbee
(74) *Attorney, Agent, or Firm* — Jordan IP Law, LLC

(57) ABSTRACT

Generating tool path data for an additive manufacturing apparatus comprises providing object design data in which at least a part of a physical object is represented by a line. A section of the line is then sliced using an intermediate slicing layer that is provided between first and second physical build layers of the additive manufacturing apparatus. The slicing generates an intermediate layer point at the intersection of the section of the line and the intermediate slicing layer, with the intermediate layer point being located between the first and second physical build layers. The intermediate layer point is then projected to a projected build layer point that lies within a physical build layer of the additive manufacturing apparatus. The projected build layer point is used to provide tool path data for that physical build layer. A similar process can be used in which the physical object is represented by a surface.

23 Claims, 5 Drawing Sheets

(51) Int. Cl.
*B22F 10/80* (2021.01)
*B33Y 50/00* (2015.01)
*B33Y 50/02* (2015.01)
*G05B 19/4099* (2006.01)

(52) U.S. Cl.
CPC .......... *B33Y 50/02* (2014.12); *G05B 19/4099* (2013.01); *G05B 2219/49013* (2013.01); *G05B 2219/49019* (2013.01)

(56) References Cited

U.S. PATENT DOCUMENTS

| | | | |
|---|---|---|---|
| 6,556,199 B1* | 4/2003 | Fang | G06T 15/08 |
| | | | 345/424 |
| 6,678,571 B1* | 1/2004 | Manners | B33Y 50/02 |
| | | | 264/401 |
| 10,890,893 B2* | 1/2021 | Revanur | G05B 19/4099 |
| 2018/0236725 A1* | 8/2018 | Susnjara | B29C 64/106 |
| 2019/0389134 A1* | 12/2019 | Woytowitz | B29C 64/386 |
| 2021/0039322 A1* | 2/2021 | Goeth | B22F 10/00 |

FOREIGN PATENT DOCUMENTS

| | | | |
|---|---|---|---|
| WO | 98/51478 | 11/1998 | |
| WO | 2011/011818 | 2/2011 | |
| WO | 2016/030883 | 3/2016 | |
| WO | WO-2018213334 A1 * | 11/2018 | B29C 64/386 |

* cited by examiner

TOOL PATH DATA GENERATION IN ADDITIVE MANUFACTURING

CROSS-REFERENCE TO RELATED APPLICATIONS

This application represents the U.S. National Phase of International Application number PCT/GB2019/051730 entitled "Tool Path Data Generation in Additive Manufacturing" filed 20 Jun. 2019, which claims priority from Great Britain Patent Application number 1810848.0 filed 2 Jul. 2018.

FIELD OF THE INVENTION

The present invention relates to generating tool path data for use in additive manufacturing.

BACKGROUND

Additive manufacturing (e.g. 3D printing) is often carried out by selective deposition or solidification of material. The selective deposition or solidification of material is often carried out in plural physical build layers within a 3D space. The physical build layers can be 2D planes or 3D surfaces. In these arrangements, the design data for an object to be manufactured is typically provided in a volumetric representation, such as STL (STereoLithography), and is then divided into slices that correspond to the physical build layers of the additive manufacturing apparatus in question. The slices are typically defined by closed contours. Tool path data that comprises points or lines, for example in a raster pattern, is then generated for each physical build layer in order to fill the areas within the closed contours. The tool path data for each physical build layer is then followed by the tool (e.g. laser) of the additive manufacturing apparatus so as to selectively deposit or solidify material so as to manufacture the physical object. This typically comprises moving the point of deposition or solidification of material along one or more tool paths. The deposition or solidification is typically either modulated from point to point along the one or more tool paths (e.g. a laser is operated at a particular point, then switched off, then moved to the next point, and then operated again) or is continuous along each of the one or more tool paths (e.g. a laser is continuously operated along each tool path).

Additive manufacturing has the advantage of being able to produce a variety of different physical objects using the same manufacturing apparatus but with different tool path data. Additive manufacturing also has the advantage of being able to produce complex objects that are extremely difficult, or in some cases impossible, to produce when using more established manufacture processes, such as subtractive, forming or casting processes. There is accordingly a strong desire for additive manufacturing to produce physical objects having similar, or in some cases better, material and/or structural properties when compared with more established manufacture processes.

However, the existing processes of generating tool path data for additive manufacturing often fail to utilise the full resolution of the additive manufacturing apparatus in question. Furthermore, the existing processes of generating tool path data for additive manufacturing often produce tool path data that produces physical objects having inferior material and/or structural properties when compared with more established manufacture processes. Furthermore, the existing processes for generating tool path data for additive manufacturing are often extremely computationally intensive, particularly for objects having fine or complex structural features.

The Applicants accordingly believe that there remains scope for improvements in generating tool path data for use in additive manufacturing.

SUMMARY

According to an aspect there is provided a computer implemented method of generating tool path data to be followed by an additive manufacturing apparatus when manufacturing a physical object, the method comprising:
  providing object design data in which at least a part of the physical object is represented by a line;
  slicing a section of the line using an intermediate slicing layer that is provided between first and second physical build layers of the additive manufacturing apparatus, wherein slicing the section of the line generates an intermediate layer point at the intersection of the section of the line and the intermediate slicing layer, wherein the intermediate layer point is located between the first and second physical build layers;
  projecting the intermediate layer point to a projected build layer point that lies within a physical build layer of the additive manufacturing apparatus; and
  using the projected build layer point to provide tool path data for that physical build layer of the additive manufacturing apparatus.

This aspect and its embodiments accordingly provides a way to generate tool path data that can be highly representative of the desired structure of the physical object by making use of an intermediate slicing layer provided between relatively coarser resolution first and second physical build layers. The resultant tool path data can accordingly make better use of the resolution of the particular additive manufacturing apparatus to be used to make the physical object. The tool path data can also produce physical objects having finer detail and/or superior material and/or structural properties, when compared with existing additive manufacturing arrangements. Embodiments can also provide a way to generate tool path data from lines that represent the physical object (e.g. in an abstract and/or parametric manner), for example without generating closed contours directly from a volumetric (e.g. STL) representation of the structural feature that the line represents. This means that the process of generating the tool path data can be less computationally intensive when compared with existing arrangements.

In embodiments, the intermediate slicing layer may not be coincident with the first and/or second physical build layer (e.g. and not coincident with one or more or all of the other physical build layers of the additive manufacturing apparatus). In embodiments, the intermediate slicing layer may be substantially parallel to the first and/or second physical build layer (e.g. and to one or more or all of the other physical build layers of the additive manufacturing apparatus).

In embodiments, the physical build layer to which the intermediate layer point is projected may be the first or second physical build layer. The first and second physical build layers may be adjacent build layers of the additive manufacturing apparatus. However, in other embodiments, the physical build layer to which the intermediate layer point is projected may be another physical build layer of the additive manufacturing apparatus, e.g. that lies between the first and second physical build layers. Thus, the first and second physical build layers may not be adjacent build layers of the additive manufacturing apparatus.

In embodiments, slicing the section of the line may comprise slicing the section of the line using plural intermediate slicing layers that are provided between the first and second physical build layers. In these embodiments, slicing the section of the line may comprise generating respective intermediate layer points at the intersections of the section of the line and respective intermediate slicing layers. The respective intermediate layer points may be located between the first and second physical build layers. These embodiments may comprise projecting each intermediate layer point to a respective projected build layer point that lies within a physical build layer of the additive manufacturing apparatus. These embodiments may comprise using the projected build layer point to provide tool path data for that physical build layer of the additive manufacturing apparatus.

Again, in embodiments, the intermediate slicing layers may not be coincident with the first and/or second physical build layer (e.g. and not coincident with one or more or all of the other physical build layers of the additive manufacturing apparatus). Again, in embodiments, the intermediate slicing layers may be parallel to the first and/or second physical build layer (e.g. and to one or more or all of the other physical build layers of the additive manufacturing apparatus). In embodiments, the physical build layer to which the intermediate layer points are projected may be the first physical build layer, the second physical build layer, and/or another physical build layer of the additive manufacturing apparatus, e.g. that lies between the first and second physical build layers.

In embodiments, the number of intermediate slicing layers used when slicing a or each section of the line and/or the number of intermediate layer points generated when slicing a or each section of the line may be selected based on a build angle for that section of the line. In embodiments, the build angle for the section of the line may be an angle between a normal to that section of the line and a normal to the first physical build layer, the second physical build layer, and/or another physical build layer of the additive manufacturing apparatus, e.g. that lies between the first and second physical build layers. For example, a relatively greater number of intermediate slicing layers may be used and/or a relatively greater number of intermediate layer points may be generated for a section of the line that is closer to being parallel to the physical build layers, e.g. having a relatively lower (shallower) build angle. This is because a section of the line that is closer to being parallel to the physical build layers may benefit from being manufactured using relatively more tool paths. Similarly, a relatively smaller number of intermediate slicing layers may be used and/or a relatively smaller number of intermediate layer points may be generated for a section of the line that is closer to being perpendicular to the physical build layers, e.g. having a relatively higher (steeper) build angle. This is because a section of the line that is closer to being perpendicular to the physical build layers may be able to be suitably manufactured using relatively fewer tool paths.

In embodiments, the number of intermediate slicing layers used when slicing the section of the line and/or the number of intermediate layer points generated when slicing the section of the line may also or instead be selected based on the build layer spacing between the first and second physical build layers for the additive manufacturing apparatus. For example, a relatively greater number of intermediate slicing layers may be used and/or a relatively greater number of intermediate layer points may be generated for a relatively greater (e.g. coarser) build layer spacing. Similarly, a relatively smaller number of intermediate slicing layers may be used and/or a relatively smaller number of intermediate layer points may be generated for a relatively smaller (e.g. finer) build layer spacing.

In embodiments, the number of intermediate slicing layers used when slicing the section of the line and/or the number of intermediate layer points generated when slicing the section of the line may also or instead be selected based on a desired tool path spacing for the additive manufacturing apparatus. The desired tool path spacing may be substantially equal to and/or less than a diameter of material that can be deposited and/or solidified by the additive manufacturing apparatus using a single tool path, e.g. so as to allow a suitable overlap of deposited and/or solidified material between adjacent tool paths. For example, a relatively greater number of intermediate slicing layers may be used and/or a relatively greater number of intermediate layer points may be generated for a relatively smaller desired tool path spacing. Similarly, a relatively smaller number of intermediate slicing layers may be used and/or a relatively smaller number of intermediate layer points may be generated for a relatively larger desired tool path spacing.

In embodiments, the number of intermediate slicing layers used when slicing the section of the line and/or the number of intermediate layer points generated when slicing the section of the line may be one or more, two or more, three or more, four or more, five or more, six or more, etc. In embodiments, slicing the section of the line may further comprise slicing the section of the line using one or more physical build layers (e.g. the first physical build layer, the second physical build layer, and/or one or more other physical build layers, e.g. that lie between the first and second physical build layers) of the additive manufacturing apparatus. In these embodiments, slicing the section of the line may also directly generate one or more direct build layer points at the respective intersections of the section of the line and the one or more physical build layers.

However, for one or more other sections of the line (e.g. that are substantially perpendicular to the build layers), the number of intermediate slicing layers used when slicing those one or more other sections of the line and/or the number of intermediate layer points generated when slicing those one or more other sections of the line may be zero. In these embodiments, those one or more other sections of the line may still be sliced using one or more physical build layers (e.g. the first physical build layer, the second physical build layer, and/or one or more other physical build layers, e.g. that lie between the first and second physical build layers) of the additive manufacturing apparatus. In these embodiments, slicing those one or more other sections of the line may again directly generate one or more direct build layer points at the respective intersections of the one or more other sections of the line and the one or more physical build layers.

In embodiments, a build angle $\theta$ for a section of the line in the range $\theta_0 \geq \theta > \theta_1$ may use zero intermediate slicing layers and/or may generate zero intermediate layer points when slicing that section of the line, and/or a build angle $\theta$ for a section of the line in the range $\theta_1 \geq \theta > \theta_2$ may use one intermediate slicing layer and/or may generate one intermediate layer point when slicing that section of the line, and/or a build angle $\theta$ for a section of the line in the range $\theta_2 \geq \theta > \theta_3$ may use two intermediate slicing layers and/or may generate two intermediate layer points when slicing that section of the line, and/or so on as desired, e.g. to cover the range 90° to 0°.

More generally, a build angle $\theta$ for a section of the line in the range $\theta_n \geq \theta > \theta_{n+1}$ may use n intermediate slicing layers and/or may generate n intermediate layer points when slicing that section of the line, where $\theta_n$ and $\theta_{n+1}$ are selected angles for a or each given n. Other relationships between the build angle $\theta$ for a section of the line and/or the number n of intermediate slicing layers used and/or the number n of intermediate layer points generated when slicing that section of the line may be used as desired.

For example, for a build layer spacing $S_{BL}$ and a desired tool path spacing $S_{TP}$, a build angle $\theta$ for a section of the line in the range $90° \geq \theta > \arctan(S_{BL}/S_{TP})°$ may use zero intermediate slicing layers and/or may generate zero intermediate layer points when slicing that section of the line, and/or a build angle $\theta$ for a section of the line in the range $\arctan(S_{BL}/S_{TP})° \geq \theta > \arctan(S_{BL}/2S_{TP})°$ may use one intermediate slicing layer and/or may generate one intermediate layer point when slicing that section of the line, and/or a build angle $\theta$ for a section of the line in the range $\arctan(S_{BL}/2S_{TP})° \geq \theta > \arctan(S_{BL}/3S_{TP})°$ may use two intermediate slicing layers and/or may generate two intermediate layer points when slicing that section of the line, and/or so on as desired, e.g. to cover the range 90° to 0°.

More generally, a build angle $\theta$ for a section of the line in the range $\arctan(S_{BL}/k_{\theta n}S_{TP})° \geq \theta > \arctan(S_{BL}/k_{\theta n+1}S_{TP})°$ may use n intermediate slicing layers and/or may generate n intermediate layer points when slicing that section of the line, where $k_{\theta n}$ and $k_{\theta n+1}$ are selected value for a or each given n. Other relationships between the build angle $\theta$ for a section of the line and/or the number n of intermediate slicing layers used and/or the number n of intermediate layer points generated when slicing that section of the line may be used as desired.

In embodiments, the spacing of the intermediate slicing layers used when slicing a section of the line, e.g. relative to each other and/or relative to the physical build layers, may be substantially uniform. For example, when n intermediate slicing layers are used and/or n intermediate layer points are generated, the intermediate layer spacing $S_{IL}$ may be given by $S_{IL}=S_{BL}/(n+1)$. Again, other (e.g. non-uniform) relationships for the intermediate layer spacing $S_{IL}$ may be used as desired.

In embodiments, the line may comprise plural line sections. For example, the line may comprise a chain of plural line sections. These embodiments may comprise dividing the line into the plural line sections. A line section may be defined by a start vertex and an end vertex. A line section may share one or more vertices with one or more other line sections. Embodiments may comprise determining the build angle for a or each line section. Embodiments may comprise including a or each line section in one of one or more groups or "domains" of one or more line sections based on the build angle for that line section. This may result in one or more groups each comprising one or more line sections. A group of one or more line sections may comprise plural line sections having build angles within a particular range of build angles, for example within one of the ranges of build angles discussed above. Thus, a group of one or more line sections may comprise plural line sections having substantially similar build angles.

The same number of intermediate slicing layers may be used and/or the same number of intermediate layer points may be generated when slicing the one or more line sections of a particular group or "domain". A different number of intermediate slicing layers may be used and/or a different number of intermediate layer points may be generated when slicing the one or more line sections of different groups or "domains". Similarly, the same intermediate layer spacing may be used when slicing the one or more line sections of a particular group or "domain". A different intermediate layer spacing may be used when slicing the one or more line sections of different groups or "domains".

In embodiments, the or each intermediate layer point may be projected to the first physical build layer, the second physical build layer and/or one or more other physical build layers, e.g. that lie between the first physical build layer and the second physical build layer, to generate a build layer point for that physical build layer. In embodiments, the or each intermediate layer point may be projected to its closest physical build layer (e.g. the closer of the first physical build layer, the second physical build layer or another physical build layer, e.g. that lies between the first physical build layer and the second physical build layer). Thus, in embodiments, the or each intermediate layer point may be projected downwards and/or upwards. In embodiments, one or more (projected and/or direct) build layer points in a relatively upper build layer may also be projected downwards to a (e.g. adjacent) relatively lower build layer. This can help to provide additional structural support underneath the one or more build layer points in the relatively upper build layer.

The downwards/lower direction and/or upwards/upper direction referred to herein in any aspect or embodiment may be with respect to the order in which the additive manufacturing apparatus builds the layers of the object in use, with the additive manufacturing apparatus building the layers progressively away from the downwards/lower direction and/or towards the upwards/upper direction. The first build layer may be a relatively lower build layer and the second build layer may be a relatively upper build layer, or vice versa.

In embodiments, at least part of the object (e.g. a structural feature of the object) may be represented abstractly and/or parametrically by the line (e.g. with a specified thickness for the line), for example rather than volumetrically (e.g. by a net of polygons that enclose a volume for the part, such as in STL). Thus, in embodiments, the line may not form part of a volumetric and/or filled and/or solid (e.g. STL) representation of the object. For example, in embodiments, a (e.g. thin) elongate structural feature of the object (e.g. a "strut") may be represented by a line (e.g. with a specified thickness) rather than by a net of polygons that enclose the volume of the elongate structural feature of the object.

In embodiments, the line that at least partially represents the object can be defined in the object design data in any desired and suitable way. In embodiments, the line that at least partially represents the object may comprise one or more straight line sections and/or one or more curved lines sections. A line formed of plural line sections may be referred to herein as a "polyline". The line that at least partially represents the object may itself be represented parametrically, for example the line may comprise one or more splines, one or more Bezier curves, etc. . . . The line that at least partially represents the object may also or instead be represented by one or more vectors, e.g. by one or more sets of two points or vertices (e.g. in 3D space), by one or more sets of a point and a gradient (e.g. in 3D space), etc. . . .

As will be appreciated, in practice, the additive manufacturing apparatus may use plural pairs of first and second physical build layers. Thus, tool path data may be generated in a similar manner for each pair of first and second physical build layers of plural pairs of first and second physical build layers for the additive manufacturing apparatus.

As will also be appreciated, in practice, the object may be represented by plural lines and/or line sections. In these embodiments, tool path data may be generated in a similar manner for each line and/or line section of plural lines and/or line sections that represent the object.

In any of the aspects or embodiments described herein, at least a part of the object may also or instead be represented by a surface. In these arrangements, tool path data may be generated from the surface in a similar manner to generating tool path data from a line as discussed above.

Thus, according to another aspect there is provided a computer implemented method of generating tool path data to be followed by an additive manufacturing apparatus when manufacturing a physical object, the method comprising:

providing object design data in which at least a part of the physical object is represented by a surface;

slicing a section of the surface using an intermediate slicing layer that is provided between first and second physical build layers of the additive manufacturing apparatus, wherein slicing the section of the surface generates an intermediate layer line at the intersection of the section of the surface and the intermediate slicing layer, wherein the intermediate layer line is located between the first and second physical build layers;

projecting the intermediate layer line to a projected build layer line that lies within a physical build layer of the additive manufacturing apparatus; and using the projected build layer line to provide tool path data for that physical build layer of the additive manufacturing apparatus.

This aspect and its embodiments again accordingly provides a way to generate tool path data that can be highly representative of the desired structure of the physical object by making use of an intermediate slicing layer provided between relatively coarser resolution first and second physical build layers. The resultant tool path data can accordingly make better use of the resolution of the particular additive manufacturing apparatus to be used to make the physical object. The tool path data can also produce physical objects having finer detail and/or superior material and/or structural properties, when compared with existing additive manufacturing arrangements. Embodiments can also provide a way to generate tool path data from surfaces that represent the physical object (e.g. in an abstract and/or parametric manner), for example without generating closed contours directly from a volumetric (e.g. STL) representation of the structural feature that the surface represents. This means that the process of generating the tool path data can be less computationally intensive when compared with existing arrangements.

In embodiments, the intermediate slicing layer may not be coincident with the first and/or second physical build layer (e.g. and not coincident with one or more or all of the other physical build layers of the additive manufacturing apparatus). In embodiments, the intermediate slicing layer may be substantially parallel to the first and/or second physical build layer (e.g. and to one or more or all of the other build layers of the additive manufacturing apparatus).

In embodiments, the physical build layer to which the intermediate layer line is projected may be the first or second physical build layer. The first and second physical build layers may be adjacent build layers of the additive manufacturing apparatus. However, in other embodiments, the physical build layer to which the intermediate layer line is projected may be another physical build layer of the additive manufacturing apparatus, e.g. that lies between the first and second physical build layers. Thus, the first and second physical build layers may not be adjacent build layers of the additive manufacturing apparatus.

In embodiments, slicing the section of the surface may comprise slicing the section of the surface using plural intermediate slicing layers that are provided between the first and second physical build layers. In these embodiments, slicing the section of the surface may comprise generating respective intermediate layer lines at the intersections of the section of the surface and respective intermediate slicing layers. The respective intermediate layer lines may be located between the first and the second physical build layers. These embodiments may comprise projecting each intermediate layer line to a respective projected build layer line that lies within a physical build layer of the additive manufacturing apparatus. These embodiments may comprise using the projected build layer line to provide tool path data for that physical build layer of the additive manufacturing apparatus.

Again, in embodiments, the intermediate slicing layers may not be coincident with the first and/or second physical build layer (e.g. and not coincident with one or more or all of the other physical build layers of the additive manufacturing apparatus). Again, in embodiments, the intermediate slicing layers may be parallel to the first and/or second physical build layer (e.g. and one or more or all of the other physical build layers of the additive manufacturing apparatus). In embodiments, the physical build layer to which the intermediate layer lines are projected may be the first physical build layer, the second physical build layer, and/or another physical build layer of the additive manufacturing apparatus, e.g. that lies between the first and second physical build layers.

In embodiments, the number of intermediate slicing layers used when slicing a section of the surface and/or the number of intermediate layer lines generated when slicing a section of the surface may be selected based on a build angle for that section of the surface. In embodiments, the build angle for the section of the surface may be an angle between a normal to that section of the surface and a normal to the first physical build layer, the second physical build layer, and/or another physical build layer of the additive manufacturing apparatus, e.g. that lies between the first and second physical build layers. For example, a relatively greater number of intermediate slicing layers may be used and/or a relatively greater number of intermediate layer lines may be generated for a section of the surface that is closer to being parallel to the physical build layers of the additive manufacturing apparatus, e.g. having a relatively lower (shallower) build angle. This is because a section of the surface that is closer to being parallel to the physical build layers may benefit from being manufactured using relatively more tool paths. Similarly, a relatively smaller number of intermediate slicing layers may be used and/or a relatively smaller number of intermediate layer lines may be generated for a section of the surface that is closer to being perpendicular to the physical build layers, e.g. having a relatively higher (steeper) build angle. This is because a section of the surface that is closer to being perpendicular to the physical build layers may be able to be suitably manufactured using relatively fewer tool paths.

In embodiments, the number of intermediate slicing layers used when slicing the section of the surface and/or the number of intermediate layer lines generated when slicing the section of the surface may also or instead be selected based on the build layer spacing between the first and second physical build layers for the additive manufacturing apparatus. For example, a relatively greater number of intermediate slicing layers may be used and/or a relatively greater number of intermediate layer lines may be generated for a relatively greater (e.g. coarser) build layer spacing. Similarly, a relatively smaller number of intermediate slicing layers may be used and/or a relatively smaller number of intermediate layer lines may be generated for a relatively smaller (e.g. finer) build layer spacing.

In embodiments, the number of intermediate slicing layers used when slicing the section of the surface and/or the number of intermediate layer lines generated when slicing the section of the surface may also or instead be selected based on a desired tool path spacing for the additive manufacturing apparatus. The desired tool path spacing may be substantially equal to and/or less than a diameter of material that can be deposited and/or solidified by the additive manufacturing apparatus using a single tool path, e.g. so as to allow a suitable overlap of deposited and/or solidified material between adjacent tool paths. For example, a relatively greater number of intermediate slicing layers may be used and/or a relatively greater number of intermediate layer lines may be generated for a relatively smaller desired tool path spacing.

Similarly, a relatively smaller number of intermediate slicing layers may be used and/or a relatively smaller number of intermediate layer lines may be generated for a relatively larger desired tool path spacing.

In embodiments, the number of intermediate slicing layers used when slicing the section of the surface and/or the number of intermediate layer lines generated when slicing the section of the surface may be one or more, two or more, three or more, four or more, five or more, six or more, etc. . . . In embodiments, slicing the section of the surface may further comprise slicing the section of the surface using one or more physical build layers (e.g. the first physical build layer, the second physical build layer, and/or one or more other physical build layers, e.g. that lie between the first and second physical build layers) of the additive manufacturing apparatus. In these embodiments, slicing the section of the surface may also directly generate one or more direct build layer lines at the respective intersections of the section of the surface and the one or more physical build layers.

However, for one or more other sections of the surface (e.g. that are substantially perpendicular to the build layers), the number of intermediate slicing layers used when slicing those one or more other sections of the surface and/or the number of intermediate layer lines generated when slicing those one or more other sections of the surface may be zero. In these embodiments, those one or more other sections of the surface may still be sliced using one or more physical build layers (e.g. the first physical build layer, the second physical build layer, and/or one or more other physical build layers, e.g. that lie between the first and second physical build layers) of the additive manufacturing apparatus. In these embodiments, slicing those one or more other sections of the surface may again directly generate one or more direct build layer lines at the respective intersections of the one or more other sections of the surface and the one or more physical build layers.

In embodiments, a build angle $\theta$ for a section of the surface in the range $\theta_0 \geq \theta > \theta_1$ may use zero intermediate slicing layers and/or may generate zero intermediate layer lines when slicing that section of the surface, and/or a build angle $\theta$ for a section of the surface in the range $\theta_1 \geq \theta > \theta_2$ may use one intermediate slicing layer and/or may generate one intermediate layer line when slicing that section of the surface, and/or a build angle $\theta$ for a section of the surface in the range $\theta_2 \geq \theta > \theta_3$ may use two intermediate slicing layers and/or may generate two intermediate layer lines when slicing that section of the surface, and/or so on as desired, e.g. to cover the range 90° to 0°.

More generally, a build angle $\theta$ for a section of the surface in the range $\theta_n \geq \theta > \theta_{n+1}$ may use n intermediate slicing layers and/or may generate n intermediate layer lines when slicing that section of the surface, where $\theta_n$ and $\theta_{n+1}$ are selected angles for a or each given n. Other relationships between the build angle $\theta$ for a section of the surface and/or the number n of intermediate slicing layers used and/or the number n of intermediate layer lines generated when slicing that section of the surface may be used as desired.

For example, for a build layer spacing $S_{BL}$ and a desired tool path spacing $S_{TP}$, a build angle $\theta$ for a section of the surface in the range $90° \geq \theta > \arctan(S_{BL}/S_{TP})°$ may use zero intermediate slicing layers and/or may generate zero intermediate layer lines when slicing that section of the surface, and/or a build angle $\theta$ for a section of the surface in the range $\arctan(S_{BL}/S_{TP})° \geq \theta > \arctan(S_{BL}/2S_{TP})°$ may use one intermediate slicing layer and/or may generate one intermediate layer line when slicing that section of the surface, and/or a build angle $\theta$ for a section of the surface in the range $\arctan(S_{BL}/2S_{TP})° \geq \theta > \arctan(S_{BL}/3S_{TP})°$ may use two intermediate slicing layers and/or may generate two intermediate layer lines when slicing that section of the surface, and/or so on as desired, e.g. to cover the range 90° to 0°.

More generally, a build angle $\theta$ for a section of the surface in the range $\arctan(S_{BL}/k_{\theta n}S_{TP})° \geq \theta > \arctan(S_{BL}/k_{\theta n+1} S_{TP})°$ may use n intermediate slicing layers and/or may generate n intermediate layer lines when slicing that section of the surface, where $k_{\theta n}$ and $k_{\theta n+1}$ are selected values for a or each given n. Other relationships between the build angle $\theta$ for a section of the surface and/or the number n of intermediate slicing layers used and/or the number n of intermediate layer lines generated when slicing that section of the surface may be used as desired.

In embodiments, the spacing of the intermediate slicing layers used when slicing a section of the surface, relative to each other and/or relative to the physical build layers may be substantially uniform. For example, when n intermediate slicing layers are used and/or n intermediate layer lines are generated, the intermediate layer spacing $S_{IL}$ may be given by $S_{IL} = S_{BL}/(n+1)$. Again, other (e.g. non-uniform) relationships for the intermediate layer spacing $S_{IL}$ may be used as desired.

In embodiments, the surface may comprise plural surface sections. For example, the surface may comprise a mesh of plural surface sections. These embodiments may comprise dividing the surface into the plural surface sections. A surface section may comprise a polygon (triangle or quadrilateral) defined by three or more vertices, or four or more vertices, etc. . . . . A surface section may share one or more vertices with one or more other surface sections. Embodiments may comprise determining the build angle for a or each surface section. Embodiments may comprise including a or each surface section in one of one or more groups or "domains" of one or more surface sections based on the build angle for that surface section. This may result in one or more groups each comprising one or more surface sections. A group of one or more surface sections may comprise plural surface sections having build angles within a particular range of build angles, for example within one of the ranges of build angles discussed above. Thus, group of one or more surface sections may comprise plural surface sections having substantially similar build angles.

The same number of intermediate slicing layers may be used and/or the same number of intermediate layer lines may be generated when slicing the one or more surface sections of a particular group or "domain". A different number of intermediate slicing layers may be used and/or a different number of intermediate layer lines may be generated when slicing the one or more surface sections of different groups or "domains". Similarly, the same intermediate layer spacing may be used when slicing the one or more surface sections of a particular group or "domain". A different intermediate layer spacing may be used when slicing the one or more surface sections of different groups or "domains".

In embodiments, the or each intermediate layer line may be projected to the first physical build layer, the second physical build layer and/or one or more other physical build layers, e.g. that lie between the first physical build layer and the second physical build layer, to generate a build layer line for that physical build layer. In embodiments, the or each intermediate layer line may be projected to its closest physical build layer (e.g. the closer of the first physical build layer, the second physical build layer or another physical build layer of the additive manufacturing apparatus, e.g. that lies between the first physical build layer and the second physical build layer). Thus, in embodiments, the or each intermediate layer line may be projected downwards and/or upwards. In embodiments, one or more (projected and/or direct) build layer lines in a relatively upper build layer may also be projected downwards to a (e.g. adjacent) relatively lower build layer. This can help to provide additional structural support underneath the one or more build layer lines in the relatively upper build layer.

The downwards/lower direction and/or upwards/upper direction referred to herein in any aspect or embodiment may be with respect to the order in which the additive manufacturing apparatus builds the layers of the object in use, with the additive manufacturing apparatus building the layers progressively away from the downwards/lower direction and/or towards the upwards/upper direction. The first build layer may be a relatively lower build layer and the second build layer may be a relatively upper build layer, or vice versa.

In embodiments, at least part of the object (e.g. a structural feature of the object) may be represented abstractly and/or parametrically by the surface (e.g. with a specified thickness for the surface), for example rather than volumetrically (e.g. by a net of polygons that enclose a volume for the part, such as in STL). Thus, in embodiments, the surface may not form part of a volumetric and/or filled and/or solid (e.g. STL) representation of the object. The surface may, for example, be open (i.e. not a closed or self-intersecting surface and/or not part of a closed or self-intersecting surface). However, in other embodiments, the surface may be closed or self-intersecting and/or may surround a non-solid and/or hollow volume. For example, in embodiments, a (e.g. thin) wall structural feature of the object may be represented by a surface (e.g. with a specified thickness) rather than by a net of polygons that enclose the volume of the wall structural feature of the object.

In embodiments, the surface that at least partially represents the object can be defined in the object design data in any desired and suitable way. In embodiments, the surface that at least partially represents the object may comprise one or more planar surface sections and/or one or more curved surface sections. Thus, in embodiments, an intermediate layer line or build layer line may comprise a straight line, a polyline and/or a curved line. The surface that at least partially represents the object may itself be represented parametrically, for example the surface may comprise one or more Bezier surfaces, etc. . . . The surface that at least partially represents the object may also or instead be represented by one or more planes, e.g. by one or more sets of three points or vertices (e.g. in 3D space), by one or more sets of two intersecting or parallel lines (e.g. in 3D space), by one or more sets of a point and a surface normal (e.g. in 3D space), etc. . . .

As will be appreciated, in practice, the additive manufacturing apparatus may use plural pairs of first and second physical build layers. Thus, tool path data may be generated in a similar manner for each pair of first and second physical build layers of plural pairs of first and second physical build layers for the additive manufacturing apparatus.

As will also be appreciated, in practice, the object may be represented by plural surfaces and/or surface sections. In these embodiments, tool path data may be generated in a similar manner for each surface and/or surface section of plural surfaces and/or surface sections that represent the object.

In any of the aspects or embodiments described herein, the tool path data may define one or more tool paths for a or each physical build layer. A tool path for a physical build layer may be provided by or between build layer points within that physical build layer. In these embodiments, two or more build layer points within a physical build layer may be connected together to form a tool path within that physical build layer. Alternatively, a tool path for a physical build layer may be provided by or along one or more build layer lines within that physical build layer. In these embodiments, two or more build layer lines within a physical build layer may be connected together to form a tool path.

In any of the aspects or embodiments described herein, providing the object design data may comprise generating object design data. In any of the aspects or embodiments described herein, providing the object design data may comprise importing object design data that has previously been generated. The object design data may be imported via a tangible, non transitory medium, such as a computer readable medium, for example, diskette, CD ROM, ROM, RAM, flash memory, or hard disk. The object design data may also or instead be imported via an interface device, either over a tangible medium, including but not limited to optical or analogue communications lines, or intangibly using wireless techniques, including but not limited to microwave, infrared or other transmission techniques.

In any of the aspects or embodiments described herein, the object design data may (e.g. initially) be provided in a first representation. The first representation may comprise a volumetric and/or filled and/or solid (e.g. Computer Aided Design (CAD) or STL) representation. The first representation may comprise a set of one or more polygons. A polygon may be represented by the coordinates of the vertices of that polygon.

In any of the aspects or embodiments described herein, the object design data may (e.g. subsequently) be provided in a parametric (e.g. abstract) representation. The parametric representation can then be used to generate tool path data, for example using a method as described herein in any aspect or embodiment in which the object is represented by one or more lines (e.g. with a specified thickness) and/or one or more surfaces (e.g. with a specified thickness).

These embodiments accordingly comprise generating tool path data from a parametric representation of the object, for example rather than from a volumetric and/or filled and/or solid (e.g. STL) representation of the object. This means that the process of generating the tool path data can be less computationally intensive. The resultant tool path data can also be closer to the resolution of the particular additive manufacturing apparatus to be used to make the physical object. The tool path data can also produce objects having finer detail and/or superior material and/or structural properties, when compared with existing additive manufacturing arrangements.

In embodiments, providing the object design data may comprise converting initial object design data from a first representation (for example a first representation as described above) to the parametric representation. The parametric representation may comprise one or more lines (e.g. with a specified thickness) and/or one or more surfaces (e.g. with a specified thickness).

In any of the aspects or embodiments described herein, the generated tool path data may be combined with the tool path data generated in any other aspect or embodiment described herein, and/or with tool path data generated in a conventional manner, as desired.

In any of the aspects or embodiments described herein, a physical build layer of the additive manufacturing apparatus (e.g. the first build layer, the second build layer, and/or one or more or all of the other physical build layers of the additive manufacturing apparatus) can be a 2D plane or a 3D surface. The planes of the physical build layers of the additive manufacturing apparatus (e.g. the first build layer, the second build layer, and/or one or more or all of the other physical build layers of the additive manufacturing apparatus) may be parallel to one another and/or may have a substantially uniform build layer spacing between adjacent physical build layers.

The method of any aspect or embodiment may be implemented in a data processing system, e.g. comprising hardware (e.g. processing circuitry) and/or software, as desired.

Thus, according to another aspect there is provided a data processing system for generating tool path data for use in additive manufacturing, the system being configured to (e.g. comprising processing circuitry configured to) perform a method of generating tool path data as described herein in any aspect or embodiment.

Similarly, according to another aspect there is provided a computer program comprising computer software code for performing a method of generating tool path data as described herein in any aspect or embodiment when the program is run on (e.g. one or more data processors of) a data processing system.

The tool path data generated in any aspect or embodiment may be used in additive manufacturing as desired.

Thus, according to another aspect there is provided a method of manufacturing a physical object comprising using an additive manufacturing apparatus to implement tool path data which has been generated in accordance with a method of generating tool path data as described herein in any aspect or embodiment.

Similarly, according to another aspect there is provided an additive manufacturing apparatus configured to manufacture a physical object by following tool path data which has been generated in accordance with a method of generating tool path data as described herein in any aspect or embodiment.

Similarly, according to another aspect there is provided a physical object manufactured using an additive manufacturing apparatus to implement tool path data which has been generated in accordance with a method of generating tool path data as described herein in any aspect or embodiment.

The physical object may comprise one or more (e.g. thin) structural features, e.g. "struts" or "walls". The one or more (e.g. thin) structural features or "struts" may be represented in the object design data by one or more lines, for example as described herein in any aspect or embodiment. The one or more (e.g. thin) structural features or "walls" may be represented in the object design data by one or more surfaces, for example as described herein in any aspect or embodiment.

Embodiments can be used for all forms of additive manufacturing, such as additive manufacturing comprising selective deposition of a material and/or selective solidification of a material. Solidification may comprise melting, fusion, setting, binding and/or curing. The material to be selectively deposited and/or solidified may be liquid or powder. The material to be selectively deposited and/or solidified may comprise metallic, plastic and/or resin material.

In some embodiments, the data processing system and/or additive manufacturing apparatus comprises, and/or is in communication with, one or more memories and/or memory devices that store object design data and/or tool path data as described herein, and/or store software code for performing a method as described herein. The data processing system may be in communication with a computer system that generates and/or provides the object design data and/or may be in communication with the additive manufacturing apparatus.

The tool path data may be provided to the additive manufacturing apparatus via a tangible, non transitory medium, such as a computer readable medium, for example, diskette, CD ROM, ROM, RAM, flash memory, or hard disk. The tool path data may also or instead be provided to the additive manufacturing apparatus via an interface device, either over a tangible medium, including but not limited to optical or analogue communications lines, or intangibly using wireless techniques, including but not limited to microwave, infrared or other transmission techniques.

Embodiments can be implemented in any suitable data processing system, such as a suitably configured computer and/or processor based system. The various functions described herein can be carried out in any desired and suitable manner. For example, the functions described herein can be implemented in hardware or software, as desired. Thus, for example, unless otherwise indicated, the various functional elements and "means" described herein may comprise a suitable processor or processors, controller or controllers, functional units, circuitry, processing logic, microprocessor arrangements, etc., that are operable to perform the various functions, etc., such as appropriately dedicated hardware elements (processing circuitry) and/or programmable hardware elements (processing circuitry) that can be programmed to operate in the desired manner.

The methods described herein may be implemented at least partially using software and/or computer programs, e.g. CAD software and/or software plugins. Thus, further embodiments comprise computer software specifically adapted to carry out a method as described herein when installed on one or more data processors, a computer program element comprising computer software code portions for performing a method as described herein when the program element is run on one or more data processors, and a computer program comprising code adapted to perform all the steps of a method as described herein when the program is run on one or more data processors.

Embodiments also extend to a computer software carrier comprising such software which when used to operate a data processing system comprising one or more data processors causes in conjunction with said one or more data processors said system to carry out the steps of a method as described herein. Such a computer software carrier could be a physical storage medium such as a ROM chip, CD ROM, RAM, flash memory, or disk, or could be a signal such as an electronic signal over wires, an optical signal or a radio signal such as to a satellite or the like.

It will further be appreciated that not all steps of the methods described herein need be carried out by computer software and thus further embodiments comprise computer software and such software installed on a computer software carrier for carrying out at least one of the steps of a method as described herein.

Embodiments may accordingly comprise a computer program product for use with a computer system. Such an implementation may comprise a series of computer readable instructions either fixed on a tangible, non transitory medium, such as a computer readable medium, for example, diskette, CD ROM, ROM, RAM, flash memory, or hard disk. It could also comprise a series of computer readable instructions transmittable to a computer system, via a modem or other interface device, either over a tangible medium, including but not limited to optical or analogue communications lines, or intangibly using wireless techniques, including but not limited to microwave, infrared or other transmission techniques. The series of computer readable instructions embodies all or part of the functionality described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink wrapped software, pre loaded with a computer system, for example, on a system ROM or fixed disk, or distributed from a server or electronic bulletin board over a network, for example, the Internet or World Wide Web.

It will also be appreciated by those skilled in the art that the above described embodiments can include, as appropriate, any one or more or all of the features described herein as appropriate.

BRIEF DESCRIPTION OF THE DRAWINGS

Various embodiments will now be described by way of example only and with reference to the accompanying drawings, in which.

DETAILED DESCRIPTION

Figure 1:
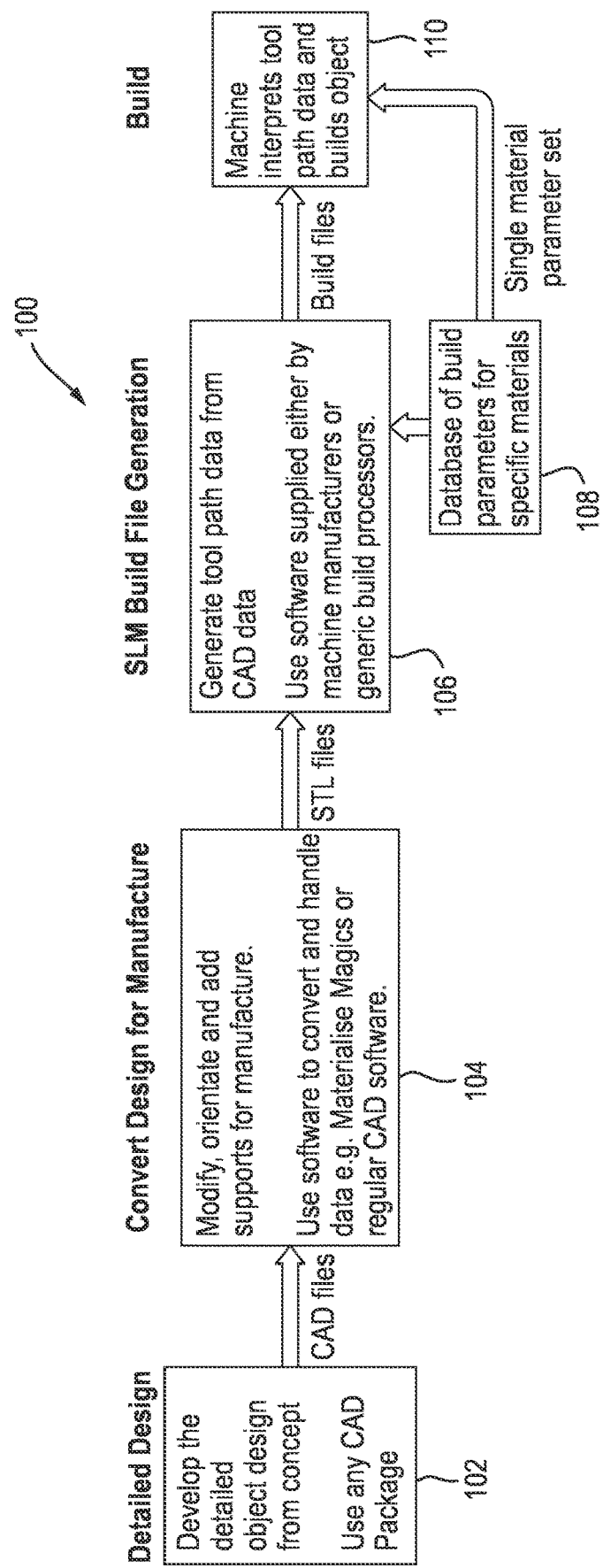
FIG. 1 shows a conventional method of generating and using tool path data.

FIG. 1 shows a conventional method of generating tool path data for use in additive manufacturing and using the tool path data to manufacture a physical object.

The method 100 begins at step 102. In step 102, object design data is developed from a design concept using conventional CAD (computer aided design) software. The object design data may comprise a volumetric representation of the object that comprises the vertices of polygons that form the object. Then, in step 104, the object design data is modified and orientated for additive manufacture, and supports are added if necessary for the additive manufacture, using software such as conventional CAD software or Materialise Magics (RTM). Then, in step 106, tool path data is generated from closed contours derived from the object design data using generic software or specific software for an additive manufacturing apparatus. The tool path data can be derived using a raster pattern of tool path points. Then, in step 108, a database provides additive manufacturing parameters, such as laser power, specific to a material to be used in the additive manufacturing. Then, in step 110, the additive manufacturing apparatus interprets the tool path data and builds the object using the specified additive manufacturing parameters for the material being used.

Figure 2:
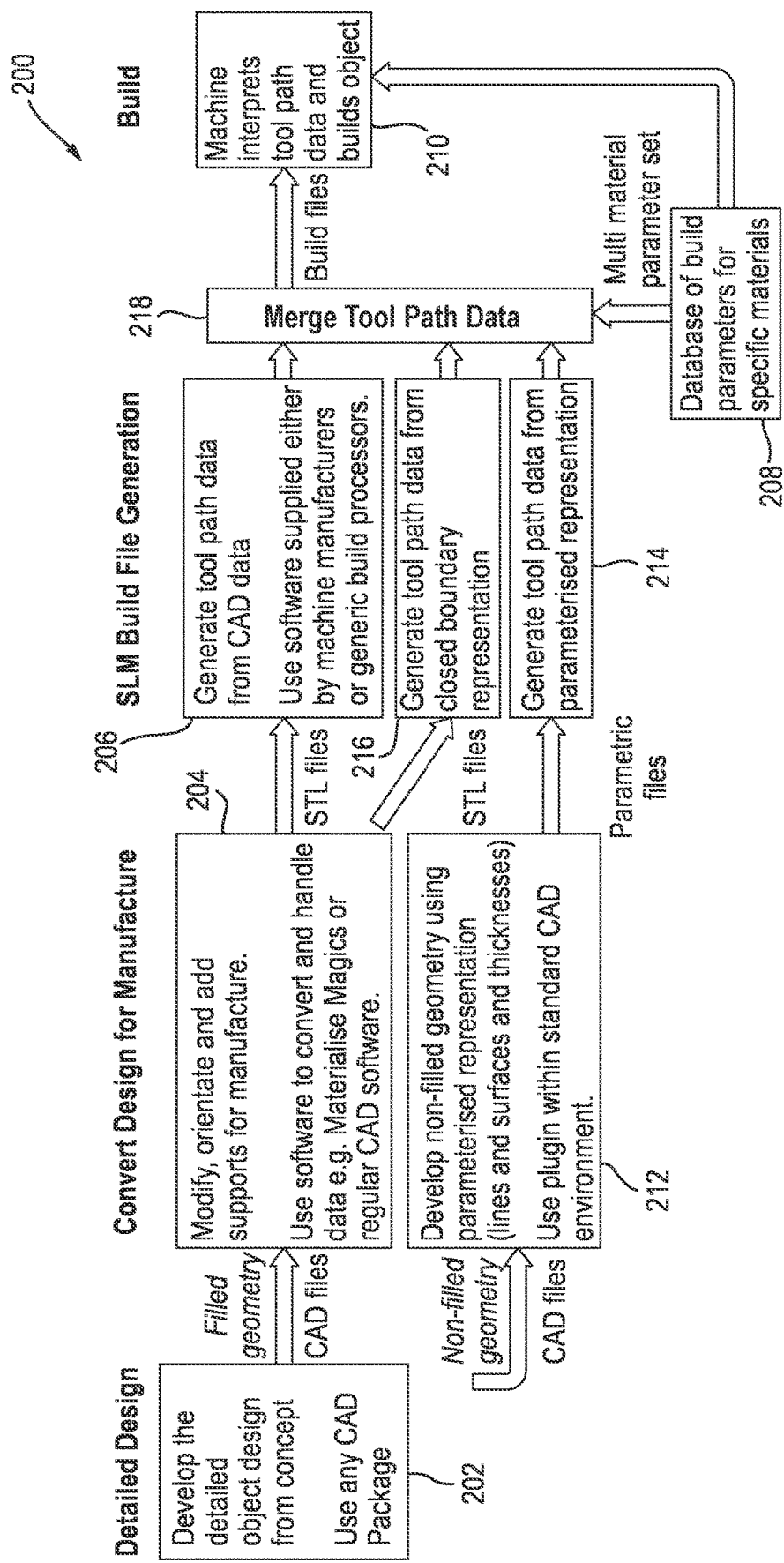
FIG. 2 shows a method of generating and using tool path data according to embodiments.

FIG. 2 shows a method of generating tool path data for use in additive manufacturing and using the tool path data to manufacture a physical object according to embodiments.

The method 200 begins at step 202. In step 202, object design data is again developed from a design concept using conventional CAD software. The object design data may comprise a volumetric representation of the object that comprises the vertices of polygons that form the object. Then, in step 204, the object design data for any filled or solid geometry is modified and orientated for additive manufacture, and supports are added if necessary for the additive manufacture, using software such as conventional CAD software or Materialise Magics (RTM). Then, in step 206, tool path data is generated from closed contours derived from the object design data for any filled geometry using generic software or specific software for an additive manufacturing apparatus. The tool path data can be derived using a raster pattern of tool path points.

Also in this embodiment, in step 212, the object design data for any non-filled, hollow or "thin" geometry is automatically converted to object design data that comprises a parametric representation using suitable software, such as a plugin for the otherwise conventional CAD software. The parametric representation defines lines and/or surfaces for the non-filled, hollow or "thin" geometry that have specified thicknesses. Then, in step 214, tool path data is automatically generated from the converted object design data for the non-filled, hollow or "thin" geometry using suitable software. This step will be described in more detail below with reference to FIGS. 3, 4A and 4B. Also, in step 216, tool path data may be automatically generated from the closed contours of the object design data for any filled geometry. Then, in step 208, a database provides additive manufacturing parameters, such as laser power, based on the material and/or tool path spacing(s) to be used in the additive manufacturing. Then, in step 218, the various sets of tool path data are merged. Then, in step 210, the additive manufacturing apparatus interprets the merged tool path data and builds the object using the specified additive manufacturing parameters for the material and/or tool path spacing(s) being used.

Figure 3:
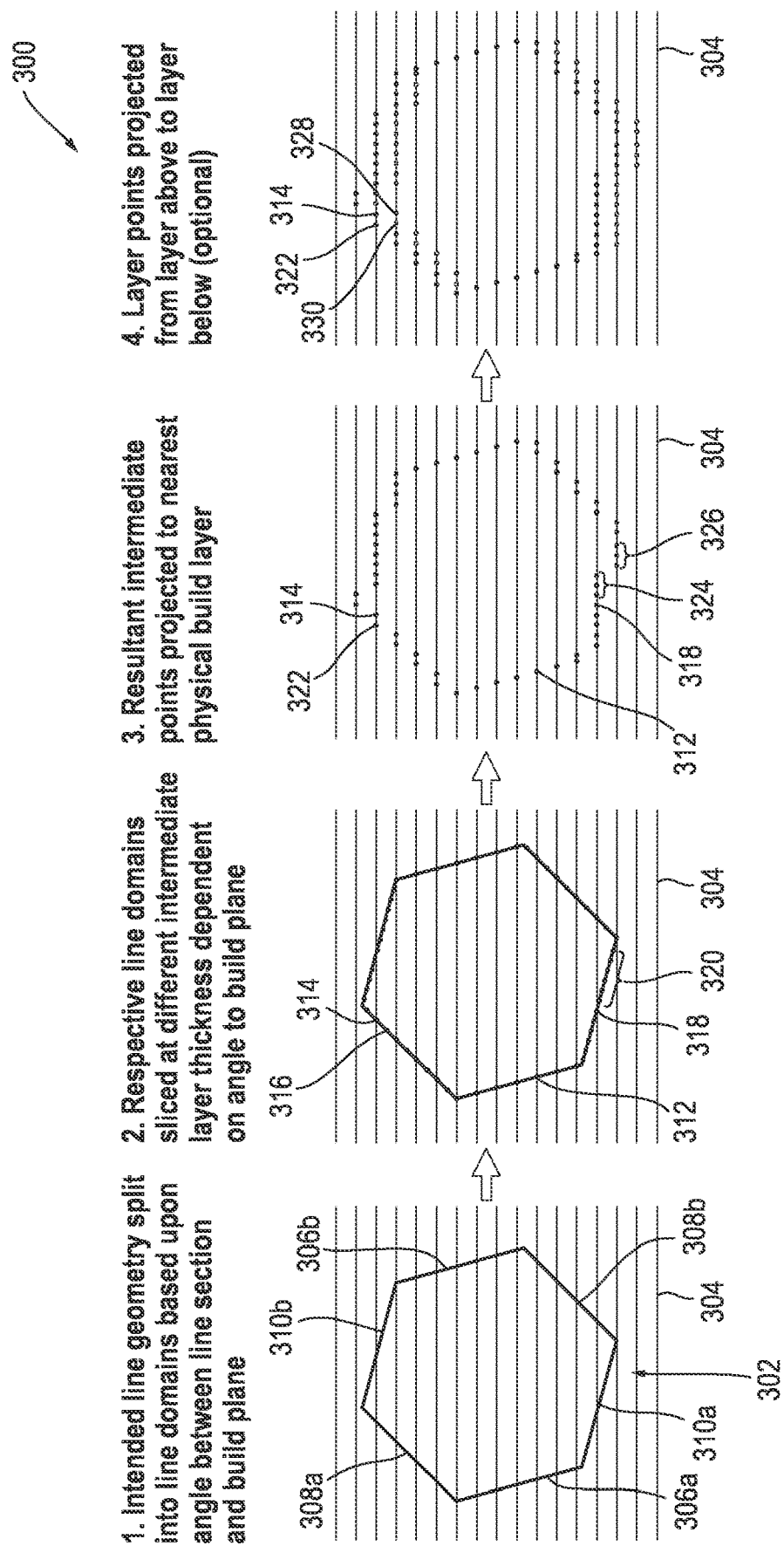
FIG. 3 illustrates a method of generating tool path data from a line that at least partially represents an object according to an embodiment.

FIG. 3 illustrates a method 300 of generating tool path data from a line that at least partially represents an object according to an embodiment.

In this embodiment, a structural feature of an object is represented in the object design data by a line 302. The line 302 is shown relative to plural physical build layers 304 for the additive manufacturing apparatus that will be used to manufacture the object. In this embodiment, the physical build layer spacing $S_{BL}$ is 60 μm and the desired tool path spacing $S_{TP}$ is 30 μm±5 μm. Other build layer spacings $S_{BL}$ and tool path spacings $S_{TP}$ can be used as desired.

In this embodiment, the line 302 comprises a closed hexagonal polyline comprising six straight line sections 306a, 306b, 308a, 308b, 310a, 310b, with each section being defined by a start vertex and an end vertex. However, in other embodiments, other line geometry such as open lines, lines having more or fewer line sections (including only a single line section) and/or one or more curved line sections may be used to represent an object as desired.

The method 300 begins in stage 1, in which the line sections 306a, 306b, 308a, 308b, 310a, 310b are grouped into "domains" based on a build angle θ for each line section. In this embodiment, the build angle θ for a line section is defined as the angle between a normal to the line section and a normal to the plane of a build layer that intersects that section. Thus, a line section that is closer to being perpendicular to the planes of the build layers 304 would have a higher or "steeper" build angle θ and a line section that is closer to being parallel to the planes of the build layers 304 would have a lower or "shallower" build angle θ. In this embodiment, the relatively more upright line sections 306a and 306b are grouped into a first domain, the relatively shallower line sections 308a and 308b are grouped into a second domain, and the relatively even shallower line sections 310a and 310b are grouped into a third domain.

Then, in stage 2, the line sections are sliced at the physical build layers to directly generate direct build layer points. The line sections of the respective domains are also sliced using different numbers of intermediate slicing layers depending on the build angles 8 for the line sections within the respective domains.

In particular, in this embodiment, the relatively more upright line sections 306a and 306b of the first domain are sliced at the physical build layers to directly generate direct build layer points (such as direct build layer point 312). However, these relatively more upright line sections 306a and 306b are not sliced using any intermediate layers between each given pair of first and second physical build layers. This is because these relatively more upright line sections 306a and 306b can be suitably manufactured using only a single build layer point per physical build layer.

The relatively shallower line sections 308a and 308b of the second domain are also sliced at the physical build layers to directly generate direct build layer points (such as direct build layer point 314). Furthermore, these relatively shallower line sections 308a and 308b are also sliced using a single intermediate slicing layer between each given pair of adjacent first and second physical build layers to generate an intermediate layer point (such as intermediate layer point 316) between each given pair of adjacent first and second physical build layers. This is because these relatively shallower line sections 308a and 308b will benefit from being manufactured using more physical build layer points per physical build layer. Here, the intermediate slicing layer spacing is $S_{IL}=S_{BL}/(n+1)=60$ μm/(1+1)=30 μm.

Similarly, the relatively even shallower line sections 310a and 310b of the third domain are also sliced at the physical build layers to directly generate direct build layer points (such as direct build layer point 318). Furthermore, these relatively even shallower line sections 310a and 310b are also sliced using six intermediate slicing layers between each given pair of adjacent first and second physical build layers to give six intermediate layer points (such as intermediate layer points 320) between each given pair of adjacent first and second physical build layers. This is because those relatively even shallower line sections 310a and 310b will benefit from being manufactured using relatively even more build layer points. Here, the intermediate slicing layer spacing is $S_{IL}=S_{BL}/(n+1)=60$ μm/(6+1)=8.57 μm.

Then, in stage 3, the intermediate layer points are projected upwards or downwards to the closest physical build layer. For example, intermediate layer point 316 is projected upwards to projected build layer point 322. Similarly, three of the six intermediate layer points 320 are projected upwards to projected build layer points 324. However, the remaining three of the intermediate layer points 320 are projected downwards to projected build layer points 326. This process of projecting the intermediate layer points to the closest physical build layer allows the resultant physical object to more closely resemble the desired line geometry.

Then, in optional stage 4, the build layer points for any line sections for which intermediate layer points have been generated are also downwardly projected to a lower build layer. For example, directly generated build layer point 314 and projected build layer point 322 for the line section 308a are projected downwards to generate further build layer points 328 and 330 respectively. This optional process allows the resultant physical object to have improved structural integrity.

Plural build layer points within a physical build layer may then be connected together to form a tool path for that physical build layer.

The method 300 of FIG. 3 accordingly provides a way to generate highly representative tool path data by making use of one or more intermediate slicing layers provided between the relatively coarser physical build layers. The resultant tool path data can accordingly make better use of the resolution of the particular additive manufacturing apparatus to be used to make the object. The tool path data can also produce objects having finer detail and/or superior material and/or structural properties, when compared with existing additive manufacturing arrangements. The method 300 of FIG. 3 also provides a way to generate tool path data from lines that represent an object (e.g. in an abstract and/or parametric manner), for example without generating closed contours directly from a volumetric (e.g. STL) representation of the object. This means that the process of generating the tool path data can be less computationally intensive when compared with existing arrangements.

Although the method 300 of FIG. 3 shows two dimensional lines that provide one dimensional tool path data for a physical build layer, it will be appreciated that the lines would generally be defined and processed in three dimensions and thus the tool path data would generally be defined in the two dimensions for a physical build layer.

Figure 4A:
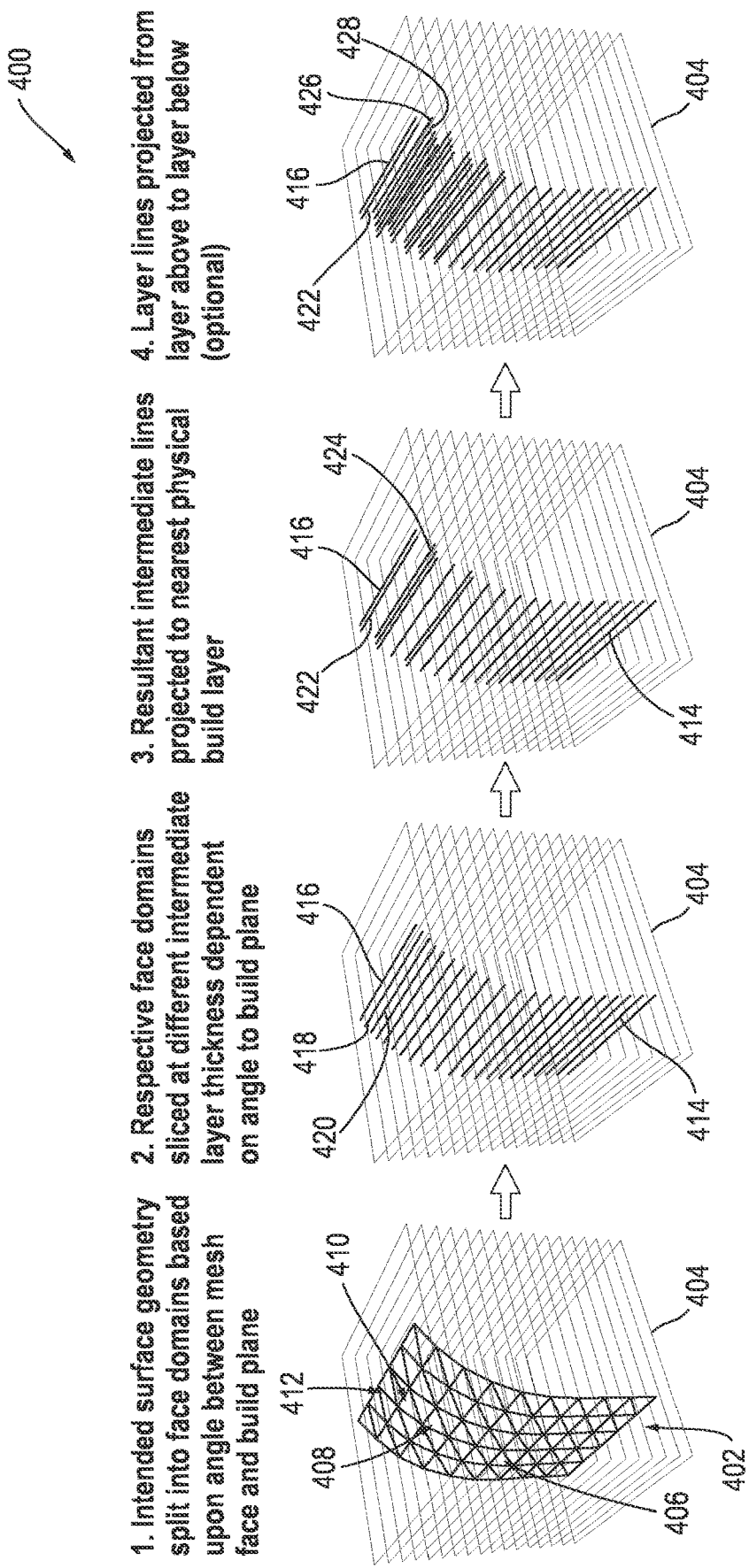
FIGS. 4A and 4B illustrate a method of generating tool path data from a surface that at least partially represents an object according to an embodiment.
Figure 4B:
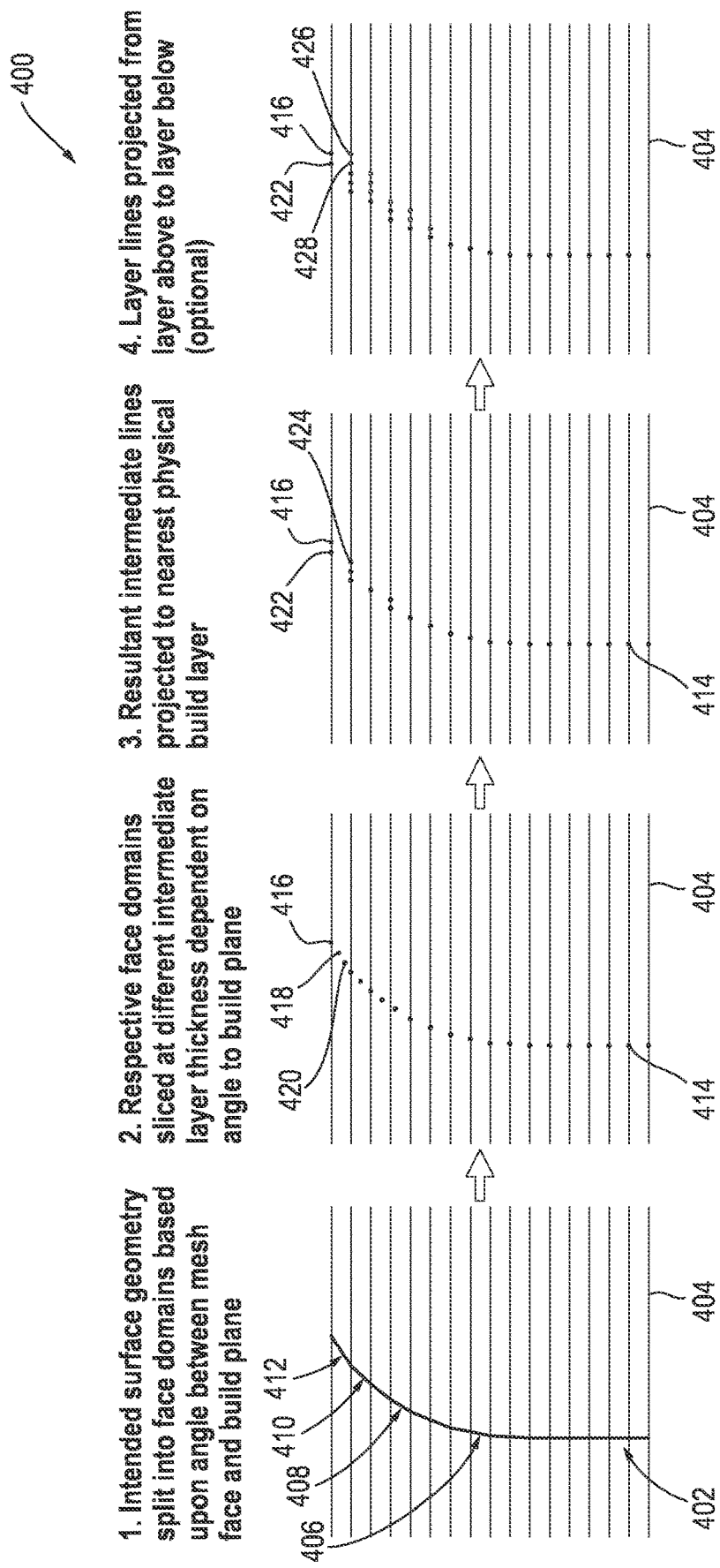

FIGS. 4A and 4B illustrate a method 400 of generating tool path data from a surface that at least partially represents an object according to an embodiment. FIG. 4A shows a perspective view and FIG. 4B shows a corresponding cross-sectional view.

In this embodiment, a structural feature of an object is represented in the object design data by a surface 402. Again, the surface 402 is shown relative to plural physical build layers 404 for the additive manufacturing apparatus that will be used to manufacture the object. Again, in this embodiment, the physical build layer spacing $S_{BL}$ is 60 μm and the desired tool path spacing $S_{TP}$ is 30 μm±5 μm. Again, other build layer spacings $S_{BL}$ and tool path spacings $S_{TP}$ can be used as desired.

In this embodiment, the surface 402 comprises an open mesh comprising 90 polygonal (triangular) surface sections or "faces", with each surface section or "face" being defined by three vertices. However, in other embodiments, other surface geometry such as closed surfaces, surfaces having more or fewer surface sections (including only a single surface section) and/or one or more curved surface sections may be used to represent an object as desired.

The method 400 begins in stage 1, in which the surface sections are grouped into domains based on a build angle θ for each surface section. In this embodiment, the build angle θ for a surface section is defined as the angle between a normal to the surface section and a normal to the plane of a build layer that intersects that section. Thus, a surface section or "face" that is closer to being perpendicular to the planes of the build layers 404 would have a higher or "steeper" build angle θ and a surface section or "face" that is closer to being parallel to the planes of the build layers 404 would have a lower or "shallower" build angle θ. In this embodiment, an area of 60 relatively more upright surface sections are grouped into a first domain 406, a strip of 10 relatively shallower surface sections are grouped into a second domain 408, another strip of 10 relatively even shallower surface sections are grouped into a third domain 410, and yet another strip of 10 relatively even shallower surface sections are grouped into a fourth domain 412.

Then, in stage 2, the surface sections are sliced at the physical build layers to directly generate physical build layer lines. The surface sections of the respective domains are also sliced using different numbers of intermediate slicing layers depending on the build angles 8 for the surface sections within the respective domains.

In particular, in this embodiment, the relatively more upright surface sections of the first domain 406 are sliced at the physical build layers to directly generate physical build layer lines (such as physical build layer line 414). However, these relatively more upright surface sections are not sliced using any intermediate layers between each given pair of first and second physical build layers. This is because these relatively more upright surface sections can be suitably manufactured using only a single build layer line per physical build layer.

The relatively shallower surface sections of the second, third and fourth domains are also sliced at the physical build layers to directly generate direct build layer lines (such as direct build layer line 416). Furthermore, these relatively shallower surface sections are also sliced using one or more intermediate slicing layers between each given pair of first and second physical build layers to generate intermediate layer lines (such as intermediate layer lines 418 and 420) between each given pair of first and second physical build layers. In particular, the relatively shallower surface sections of the second domain 408 are sliced using two intermediate slicing layers between non-adjacent physical build layers, the relatively even shallower surface sections of the third domain 410 are sliced using one intermediate slicing layer between adjacent physical build layers, and the relatively even shallower surface sections of the fourth domain 412 are sliced using two intermediate slicing layers between adjacent physical build layers. This is because these progressively relatively shallower surface sections would benefit from being manufactured using progressively more physical build layer lines per physical build layer.

Then, in stage 3, the intermediate layer lines are projected upwards or downwards to the closest physical build layer. For example, intermediate layer line 418 is projected upwards to projected build layer line 422 and intermediate layer line 420 is projected downwards to projected build layer line 424. This process of projecting the intermediate layer lines to the closest physical build layer allows the resultant physical object to more closely resemble the desired surface geometry.

Then, in optional stage 4, the build layer lines for any surface sections for which intermediate layer lines have been generated are also downwardly projected to a lower build layer. For example, directly generated layer line 416 and projected layer line 422 are projected downwards to generate further build layer lines 426 and 428 respectively. This optional process allows the resultant physical object to have improved structural integrity.

A build layer line within a physical build layer may be used as a tool path for that physical build layer. Alternatively, plural build layer lines within a physical build layer may be connected together to form a tool path for that physical build layer.

The method 400 of FIGS. 4A and 4B accordingly again provides a way to generate highly representative tool path data by making use of one or more intermediate slicing layers provided between relatively coarser resolution physical build layers. The resultant tool path data can accordingly make better use of the resolution of the particular additive manufacturing apparatus to be used to make the object. The tool path data can also produce objects having finer detail and/or superior material and/or structural properties, when compared with existing additive manufacturing arrangements. The method 400 of FIGS. 4A and 4B also provides a way to generate tool path data from surfaces that represent an object (e.g. in an abstract and/or parametric manner), for example without generating closed contours directly from a volumetric (e.g. STL) representation of the object. This means that the process of generating the tool path data can be less computationally intensive when compared with existing arrangements.

Although the present invention has been described with reference to various embodiments, it will be understood by those skilled in the art that various changes in form and detail may be made without departing from the scope of the invention as set forth in the accompanying claims.

The invention claimed is:

1. A computer implemented method of generating tool path data to be followed by an additive manufacturing apparatus when manufacturing a physical object, the method comprising:
   providing object design data in which a structural feature forming part of the physical object is represented by generating a parametric representation of the structural feature in the form of a line or surface, wherein the line or surface does not ever form part of a volumetric representation which encloses a volume of the physical object;
   then slicing a section of the line or surface using an intermediate slicing layer that is provided between first and second physical build layers of the additive manufacturing apparatus, wherein slicing the section of the line or surface generates an intermediate layer point or line at an intersection of the section of the line or surface and the intermediate slicing layer, wherein the intermediate layer point or line is located between the first and second physical build layers;
   projecting the intermediate layer point or line to a projected build layer point or line that lies within a physical build layer of the additive manufacturing apparatus; and using the projected build layer point or line to provide tool path data for that physical build layer.

2. A method as claimed in claim 1, wherein slicing the section of the line or surface comprises slicing the section of the line or surface using plural intermediate slicing layers that are provided between the first and second physical build layers, wherein slicing the section of the line or surface comprises generating respective intermediate layer points or lines at intersections of the section of the line or surface and respective intermediate slicing layers, and wherein the intermediate layer points or lines are located between the first and second physical build layers, the method further comprising projecting each intermediate layer point or line to a respective projected build layer point or line that lies within a physical build layer of the additive manufacturing apparatus, and using the projected build layer point or line to provide tool path data for that physical build layer.

3. A method as claimed in claim 1, wherein a number of intermediate slicing layers used when slicing the section of the line or surface is selected based on at least one of:
(i) a build angle for that section of the line or surface;
(ii) a build layer spacing between the first and second physical build layers of the additive manufacturing apparatus; and
(iii) a desired tool path spacing for the additive manufacturing apparatus.

4. A method as claimed in claim 3, wherein the build angle for the section of the line or surface is an angle between a normal to that section of the line or surface and a normal to a physical build layer of the additive manufacturing apparatus.

5. A method as claimed in claim 3, wherein at least one of:
(i) a greater number of intermediate slicing layers is used for a section of the line or surface that is closer to being parallel to a physical build layer of the additive manufacturing apparatus, and a smaller number of intermediate slicing layers is used for a section of the line or surface that is closer to being perpendicular to a physical build layer of the additive manufacturing apparatus;
(ii) a greater number of intermediate slicing layers is used for a greater build layer spacing, and a smaller number of intermediate slicing layers is used for a smaller build layer spacing; and
iii) a greater number of intermediate slicing layers is used for a smaller desired tool path spacing, and a smaller number of intermediate slicing layers is used for a larger desired tool path spacing.

6. A method as claimed in claim 1, wherein slicing the section of the line or surface further comprises slicing the section of the line or surface using one or more physical build layers of the additive manufacturing apparatus, wherein slicing the section of the line or surface using one or more physical build layers of the additive manufacturing apparatus comprises directly generating one or more direct build layer points or lines that lie within the one or more physical build layers of the additive manufacturing apparatus.

7. A method as claimed in claim 1, wherein a number of intermediate slicing layers used when slicing one or more other sections of the line or surface is zero.

8. A method as claimed in claim 1, wherein n intermediate slicing layers are used when slicing a section of the line or surface when a build angle θ for the section of the line or surface is in a range $\theta_n \geq \theta > \theta_{n+1}$, where $\theta_n$ and $\theta_{n+1}$ are selected angles for a or each given n.

9. A method as claimed in claim 1, wherein n intermediate slicing layers are used when slicing the section of the line or surface when a build angle θ for the section of the line or surface is in a range arctan $(S_{BL}/k_{\theta_n} S_{TP})° \geq \theta >$ arctan $(S_{BL}/k_{\theta_{n+1}} S_{TP})°$, where $k_{\theta_n}$ and $k_{\theta_{n+1}}$ are selected values for a or each given n, $S_{BL}$ is a build layer spacing between the first and second physical build layers of the additive manufacturing apparatus, and $S_{TP}$ is a desired tool path spacing.

10. A method as claimed in claim 1, wherein a spacing of the intermediate slicing layers used when slicing the section of the line or surface is substantially uniform.

11. A method as claimed in claim 1, wherein the line or surface comprises plural line or surface sections, the method further comprising including each line or surface section in one of plural groups of one or more line or surface sections based on a build angle for that line or surface section, and using a same number of intermediate slicing layers when slicing plural line or surface sections of a particular group.

12. A method as claimed in claim 1, wherein the intermediate layer point or line is projected to its closest physical build layer of the additive manufacturing apparatus.

13. A method as claimed in claim 1, wherein one or more build layer points or lines in an upper build layer are also projected downwards to a lower build layer.

14. A method as claimed in claim 1, further comprising converting the structural feature of the physical object so as to be represented parametrically by the line or surface.

15. A method as claimed in claim 1, wherein the structural feature of the physical object is an elongate structural feature represented by the line.

16. A method as claimed in claim 1, wherein the structural feature of the physical object is a wall structural feature represented by the surface.

17. A method as claimed in claim 1, further comprising manufacturing the physical object, wherein manufacturing the physical object comprises using the additive manufacturing apparatus to implement the tool path data.

18. A method as claimed in claim 1, wherein the line or surface does not form part of at least one of: (i) a net of polygons which encloses the volume of the physical object; and (ii) a STereoLithography (STL) representation of the physical object.

19. A method as claimed in claim 1, wherein generating the tool path data does not comprise generating closed contours for the structural feature that the line or surface represents.

20. A method as claimed in claim 15, wherein the elongate structural feature is represented by the line together with a specified thickness for the line.

21. A method as claimed in claim 16, wherein the wall structural feature is represented by the surface together with a specified thickness for the surface.

22. A data processing system for generating tool path data for use in additive manufacturing, the system comprising processing circuitry configured to perform a method of generating tool path data to be followed by an additive manufacturing apparatus when manufacturing a physical object, the processing circuitry being configured to:
provide object design data in which a structural feature forming part of the physical object is represented by generating a parametric representation of the structural feature in the form of a line or surface, wherein the line or surface does not ever form part of a volumetric representation which encloses a volume of the physical object;
then slice a section of the line or surface using an intermediate slicing layer that is provided between first and second physical build layers of the additive manufacturing apparatus, wherein slicing the section of the line or surface generates an intermediate layer point or line at an intersection of the section of the line or surface and the intermediate slicing layer, wherein the intermediate layer point or line is located between the first and second physical build layers;

project the intermediate layer point or line to a projected build layer point or line that lies within a physical build layer of the additive manufacturing apparatus; and use the projected build layer point or line to provide tool path data for that physical build layer.

23. A non transitory computer readable medium comprising computer software code which when used to operate a data processing system comprising one or more data processors causes, in conjunction with said one or more data processors, said system to carry out a method of generating tool path data to be followed by an additive manufacturing apparatus when manufacturing a physical object, the method comprising:

providing object design data in which a structural feature forming part of the physical object is represented by generating a parametric representation of the structural feature in the form of a line or surface, wherein the line or surface does not ever form part of a volumetric representation which encloses a volume of the physical object;

then slicing a section of the line or surface using an intermediate slicing layer that is provided between first and second physical build layers of the additive manufacturing apparatus, wherein slicing the section of the line or surface generates an intermediate layer point or line at an intersection of the section of the line or surface and the intermediate slicing layer, wherein the intermediate layer point or line is located between the first and second physical build layers;

projecting the intermediate layer point or line to a projected build layer point or line that lies within a physical build layer of the additive manufacturing apparatus; and using the projected build layer point or line to provide tool path data for that physical build layer.

\* \* \* \* \*